US012736880B2

(12) United States Patent
Liu et al.

(10) Patent No.: US 12,736,880 B2
(45) Date of Patent: Sep. 15, 2026

(54) METHOD FOR COATING TOP ANTI-REFLECTIVE COATING

(71) Applicant: United Semiconductor (Xiamen) Co., Ltd., Xiamen (CN)

(72) Inventors: Dian Han Liu, Shamen City (CN); Maohua Ren, Shamen City (CN); Yuan-Chi Pai, Shamen City (CN); Wen Yi Tan, Shamen City (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 499 days.

(21) Appl. No.: 18/241,904

(22) Filed: Sep. 4, 2023

(65) Prior Publication Data

US 2025/0044693 A1 Feb. 6, 2025

(30) Foreign Application Priority Data

Aug. 4, 2023 (CN) ......................... 202310979848.2

(51) Int. Cl.
*G03F 7/09* (2006.01)
*G03F 7/16* (2006.01)

(52) U.S. Cl.
CPC .............. *G03F 7/091* (2013.01); *G03F 7/162* (2013.01)

(58) Field of Classification Search
CPC . G03F 7/091; G03F 7/162; G03F 1/46; G03F 1/56; B05D 1/005; B05D 5/06
USPC .......................................... 430/327, 330, 311
See application file for complete search history.

(56) References Cited

U.S. PATENT DOCUMENTS

2007/0264594 A1* 11/2007 Chang ....................... G03F 7/40 430/311
2010/0151126 A1* 6/2010 Iseki ...................... B05D 1/005 118/695
2023/0384678 A1* 11/2023 Tsai ........................ G03F 7/168
2024/0063017 A1* 2/2024 Zhong ..................... G03F 7/162

* cited by examiner

*Primary Examiner* — Caleen O Sullivan
(74) *Attorney, Agent, or Firm* — Winston Hsu

(57) ABSTRACT

The invention provides a method for coating top anti-reflective coating (TARC), which comprises the following steps: providing a turntable, placing a substrate above the turntable with a photoresist layer on the substrate, spraying deionized water on the photoresist layer, spraying a top anti-reflective coating liquid on the deionized water to mix the top anti-reflective coating liquid with the deionized water to form a mixed liquid, and performing a spin coating step to spin-coat and disperse the mixed liquid to form a top anti-reflective coating film on the photoresist layer.

13 Claims, 6 Drawing Sheets

15
17
16
18
16
14
12
10

METHOD FOR COATING TOP ANTI-REFLECTIVE COATING

BACKGROUND OF THE INVENTION

1. Field of the Invention

The invention relates to the field of semiconductors, in particular to a method for coating a top anti-reflective coating on the surface of a photoresist layer.

2. Description of the Prior Art

In the semiconductor manufacturing process, it is quite common to form patterned material layers. The patterning step generally includes: coating a photoresist layer on a material layer, exposing and developing the photoresist layer to form a patterned photoresist layer, and then generally using the patterned photoresist layer as a mask and performing an etching step to etch the material layer not blocked by the mask below.

In the above patterning step, it is necessary to form a photoresist layer on the surface of the material layer. However, in the exposure process, in order to avoid poor exposure effect caused by light reflection of the photoresist layer, a top anti-reflective coating (TARC) is often formed on the surface of the photoresist layer. The main function of TARC is to reduce light reflection and improve the success rate of the exposure process. Therefore, the quality of the formed TARC will also affect the yield of the exposure step in the semiconductor process. At present, there are still some shortcomings in the process of forming TARC that need to be improved, so an improved method of forming TARC needs to be developed.

SUMMARY OF THE INVENTION

The invention provides a method for coating top anti-reflective coating, which comprises the following steps: providing a turntable, placing a substrate above the turntable with a photoresist layer on the substrate, spraying deionized water on the photoresist layer, spraying a top anti-reflective coating liquid on the deionized water to mix the top anti-reflective coating liquid with the deionized water to form a mixed liquid, and performing a spin coating step to spin-coat and disperse the mixed liquid to form a top anti-reflective coating film on the photoresist layer.

The invention also provides a method for coating a top anti-reflective coating, which comprises the following steps: providing a turntable, placing a substrate above the turntable, and spraying deionized water on the photoresist layer, wherein the spraying position of deionized water is located at a first offset position, and the first offset position is located at a unit distance beside a central point of the photoresist layer, when the deionized water is sprayed on the surface of the photoresist layer, the turntable simultaneously performs an instantaneous rotation step, spraying a top anti-reflective coating liquid on deionized water to mix the top anti-reflective coating liquid with deionized water to form a mixed liquid, and performing a spin coating step to spin-coat and disperse the mixed liquid to form a top anti-reflective coating film on the photoresist layer.

The invention is characterized by providing a method for coating a top anti-reflective coating, which comprises the following steps: spraying deionized water on a photoresist layer, mixing the top anti-reflective coating liquid with deionized water before the deionized water is spin-coated, and then spin-coating the mixed liquid. By the method provided by the invention, the consumption of the top anti-reflective coating liquid in the exposure process can be greatly reduced, thereby reducing the cost. In addition, the method provided by the invention can also solve the problems of micro bubbles, central region depression and the like that may be encountered when forming the top anti-reflective coating.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
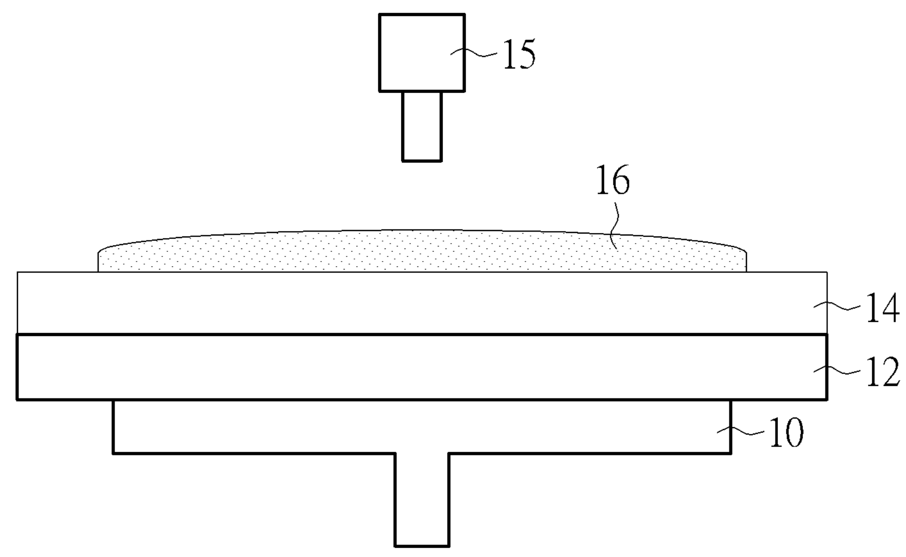
FIGS. 1 to 4 are schematic diagrams illustrating a method for coating a top anti-reflective coating according to a first preferred embodiment of the present invention.

FIGS. 1 to 4 are schematic diagrams illustrating a method for coating a top anti-reflective coating according to a first preferred embodiment of the present invention. As shown in FIG. 1, firstly, a turntable 10 is provided, on which a substrate 12 is placed, and a photoresist layer 14 is coated on the substrate 12. The turntable 10 described here is, for example, a turntable used for spin coating in a semiconductor process. The substrate 12 is, for example, a wafer or other suitable material layer, and the photoresist layer 14 is a photoresist material suitable for a semiconductor process.

Next, in order to reduce the reflectivity of the photoresist layer 14, it is necessary to coat a top anti-reflective coating (TARC) on the surface of the photoresist layer 14. The top anti-reflective coating (TARC) described here is the same as or similar to the conventional TARC material used in semiconductor manufacturing, and its material includes, for example, a mixture of materials such as crosslinkable resin, thermal acid generator, surfactant and solvent. However, the applicant found that TARC material is usually water-soluble and therefore highly hydrophilic, while the photoresist layer 14 itself is not an aqueous solution, so when TARC is directly coated on the photoresist layer 14, a large amount of TARC solution will be consumed to form enough TARC layer on the surface of the photoresist layer 14, which will increase the cost.

Figure 2:
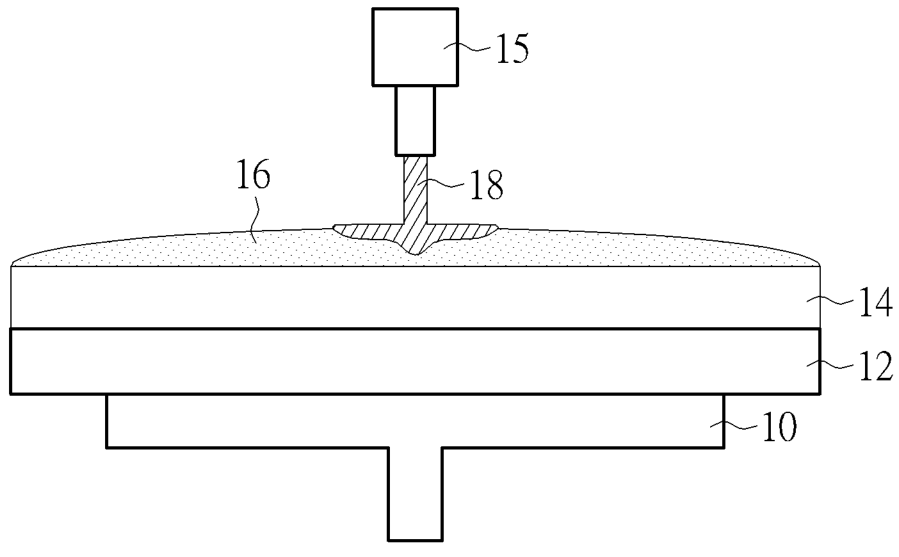

In order to solve the above problems, please refer to FIG. 1 of the first embodiment of the present invention. A nozzle 15 sprays deionized water 16 on the surface of the photoresist layer 14. After spraying the deionized water 16, the turntable 10 rotates and drives the substrate 12 disposed thereon, so that the deionized water 16 diffuses outward from the central region of the photoresist layer 14 by centrifugal force and is evenly distributed on the surface of the photoresist layer 14. In this embodiment, for example, the rotation speed is 400 rpm for 0.2 seconds, but it is not limited to this. Next, as shown in FIG. 2, a TARC liquid 18 is sprayed on the surface of deionized water 16. It is worth noting that in this embodiment, when the TARC liquid 18 is sprayed, the deionized water 16 has been uniformly distributed on the surface of photoresist layer 14 and formed a thin water film. This method of forming a thin water film with deionized water 16 can also be regarded as a pre-wet method. Because the TARC liquid 18 can be dissolved in deionized water 16, therefore, a thin water film of deionized water 16 can be formed on the photoresist layer 16 before spraying the TARC liquid 18, and it can effectively improve the adhesion of the TARC liquid 18 and greatly reduce the dosage of spraying the TARC liquid 18. According to the applicant's observation, the consumption of each wafer can be reduced by more than half (the original TARC solution required for each wafer is about 2.0 c.c, which can be reduced to less than 1.0c.c by using the method of the present invention).

Figure 3:
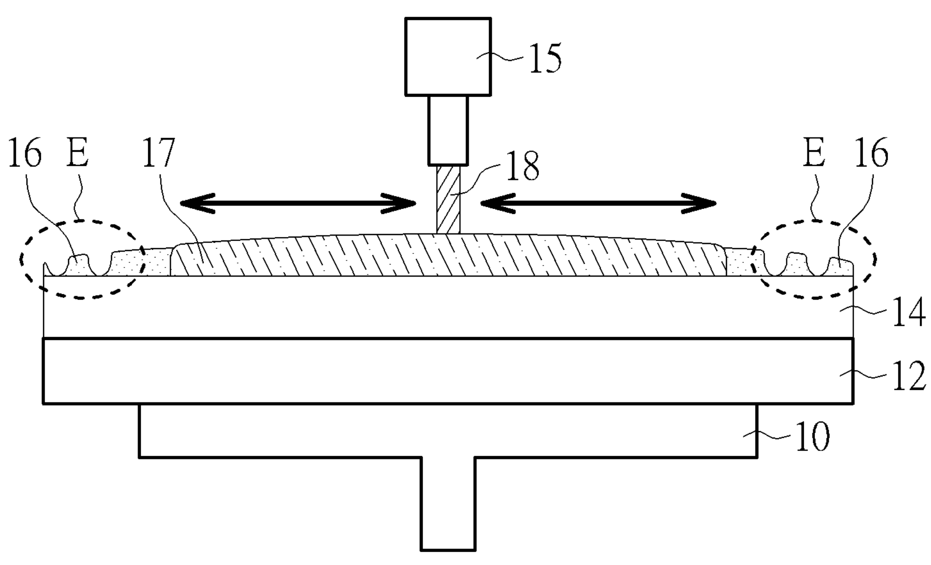
Figure 4:
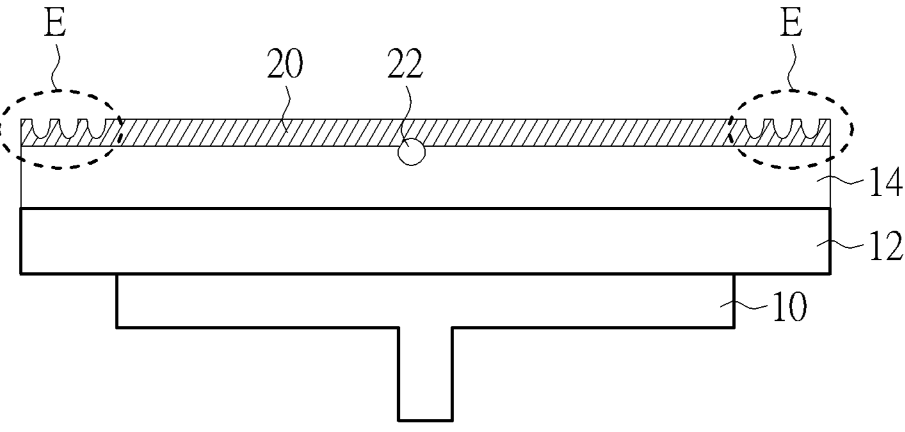

When spraying the TARC liquid 18, the TARC liquid 18 can be diffused and coated on the entire surface of the photoresist layer 14 by alternately rotating at high and low speeds. In this embodiment, for example, it rotates at a medium speed of 700 rpm for 0.3 seconds, then rotates at a low speed of 100 rpm for 0.5 seconds, and then rotates at a high speed of 3200 rpm for 0.3 seconds, but the present invention is not limited to this. However, the applicant found that there are still some problems in the first embodiment of the present invention. As shown in FIG. 3, the TARC liquid 18 is mixed with the thin water film of deionized water 16 to form a mixed liquid 17. In the process of rotation, the thin water film formed by deionized water 16 at the edge portion E of the photoresist layer 14 may fly away, resulting in insufficient TARC liquid adhering to the photoresist layer 14 at the edge portion E. As shown in FIG. 4, after the subsequent baking step, the TARC liquid 18 is dried to form a TARC film 20. The applicant found that the TARC film 20 at the edge E of the photoresist layer 14 is not completely formed, and it is easy to generate micro bubbles. In addition, a cavity 22 may also be generated in the photoresist layer 14 at the central region, which will affect the quality of subsequent exposure.

Figure 5:
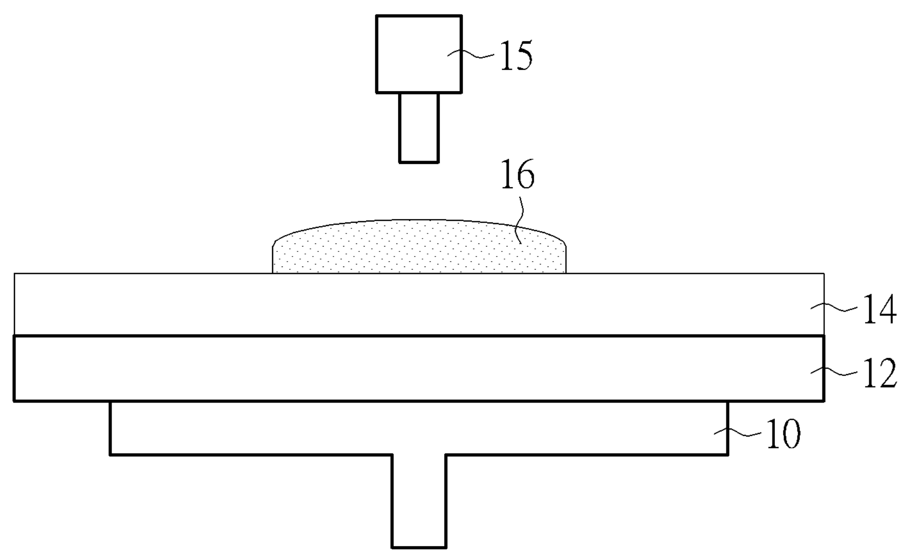
FIGS. 5 to 8 are schematic diagrams illustrating a method for coating a top anti-reflective coating according to a second preferred embodiment of the present invention.
Figure 6:
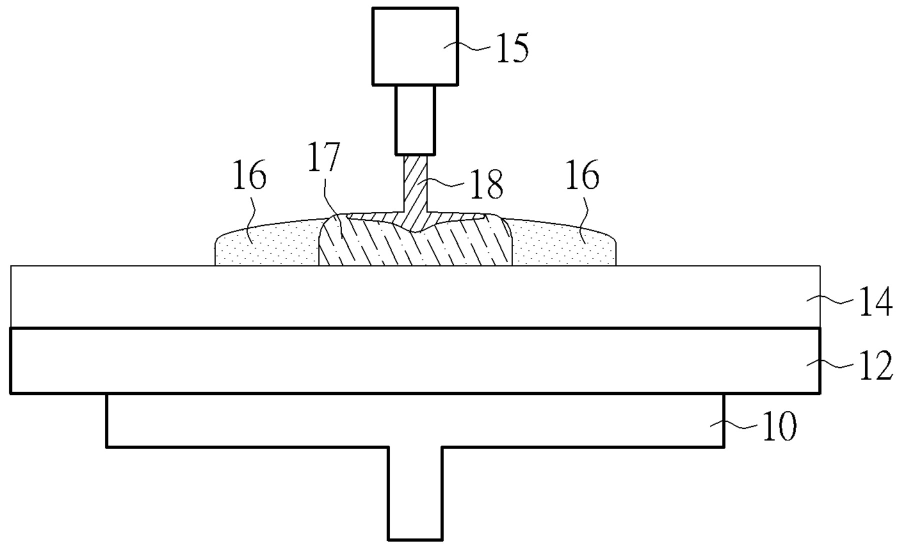
Figure 7:
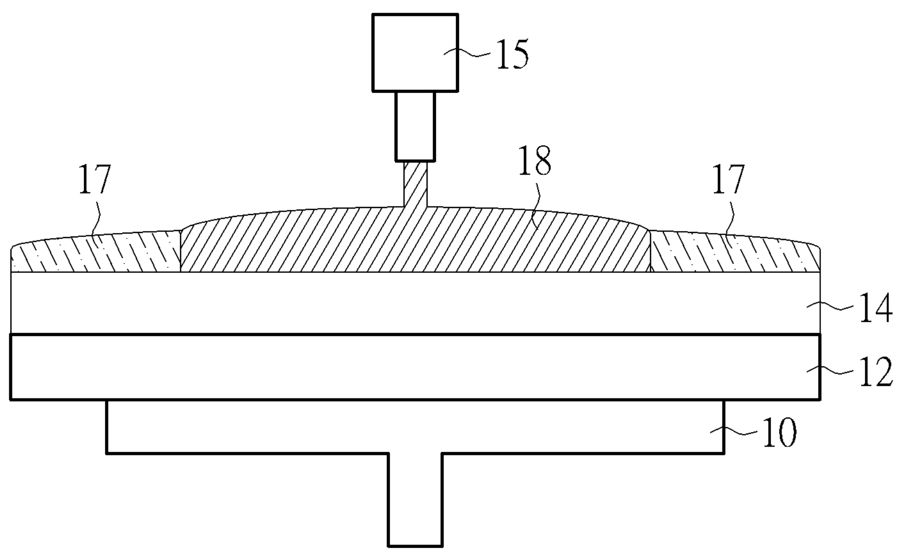

Therefore, in order to solve the above problems, the present invention provides a second preferred embodiment of a method for coating a top anti-reflective coating. FIGS. 5 to 8 are schematic diagrams illustrating a method for coating a top anti-reflective coating according to a second preferred embodiment of the present invention. As shown in FIG. 5, this embodiment also provides a turntable 10, a substrate 12 on the turntable 10, and a photoresist layer 14 on the substrate 12. The main difference between this embodiment and the first embodiment is that the deionized water 16 is not rotated at first or only rotated at a low speed for a short time (for example, 50 rpm rotation for 0.1 second or not), so that the deionized water 16 is still located in the central region of the photoresist layer 14. Then, as shown in FIG. 6 and FIG. 7, when the deionized water 16 has not been spin-coated, the TARC liquid 18 is directly sprayed on the deionized water 16 to be mixed with it, and a mixed liquid 17 is generated, and at the same time, a rotating step (for example, rotating at a low speed of 200 rpm for 1 second and then rotating at a high speed of 3200 rpm for 0.5 seconds, but not limited to this) is performed, and the mixed liquid 17 of the deionized water 16 and the TARC liquid 18 is spin-coated from the central region of the photoresist layer 14 to the whole photoresist layer 14. That is, in this embodiment, the TARC liquid 18 and the deionized water 16 are mixed at the central region of the photoresist layer 14, and then coated around the photoresist layer 14 in a rotating manner. Different from the above-mentioned first embodiment, since the thin water film of deionized water 16 is not formed first, unlike the pre-wet step, there is no thin water film scattered at the edge of the photoresist layer 14, so the problem of generating micro bubbles at the edge of the TARC film 20 as described in the first embodiment can be avoided.

Figure 8:
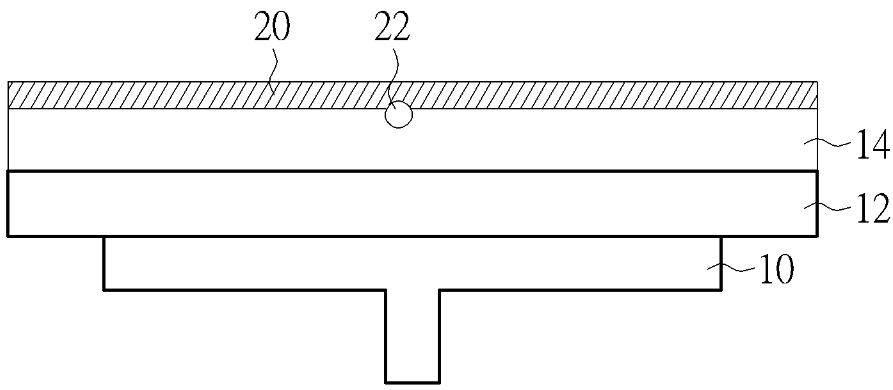

However, as shown in FIG. 8, the applicant found that although the problem of micro bubbles in the surrounding area of the TARC film has been solved in this embodiment, a cavity 22 may still be generated in the central region of the photoresist layer 14. According to the observation of the applicant, it is found that the reason of the central cavity 22 is generated is that when the deionized water 16 is sprayed on the surface of the photoresist layer 14, the water column will have a strong impact on the surface of the photoresist layer 14 for the first time (please note that the applicant found that only the water column will have a strong impact for the first time, but the water column will have a weak impact in the subsequent continuous spraying process), so a groove will be generated on the surface of the central region of the photoresist layer 14, and this groove will become a cavity 22 as shown in FIG. 8 after the baking step.

Figure 9:
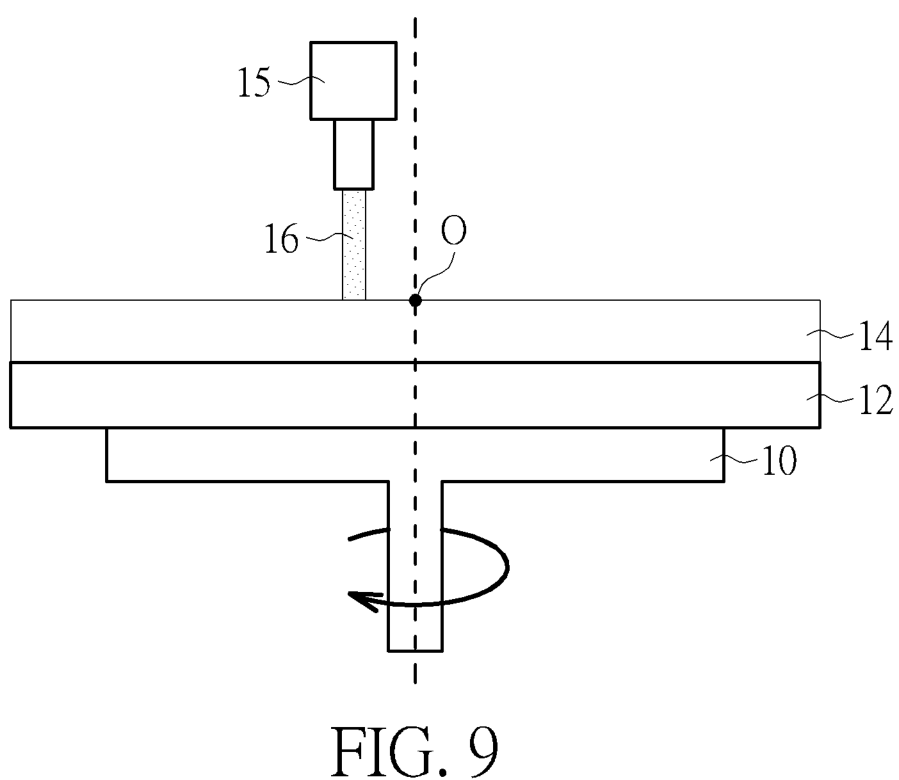
FIGS. 9 to 12 are schematic diagrams showing a method for coating a top anti-reflective coating according to a third preferred embodiment of the present invention.

Therefore, in order to solve the above problems, the present invention provides a third preferred embodiment of a method for coating a top anti-reflective coating. FIGS. 9 to 12 are schematic diagrams showing a method for coating a top anti-reflective coating according to a third preferred embodiment of the present invention. As shown in FIG. 9, this embodiment also provides a turntable 10, a substrate 12 on the turntable 10, and a photoresist layer 14 on the substrate 12. The main difference between this embodiment and the first or second embodiment is that in the above embodiments, when spraying the deionized water, the water column is aimed at the central region of the photoresist layer (or at the center of the wafer), while in this embodiment, the nozzle 15 for spraying deionized water 16 is aimed at the lateral displacement of the center point of the photoresist layer 14 by a unit distance, for example, 7 mm next to the center point O, but not limited to this. It is also worth noting that while the nozzle 15 sprays the deionized water 16 and contacts the photoresist layer 14, the turntable 10 rotates instantaneously, for example, at 400 rpm for 0.3 seconds (but the actual value is not limited to this), so as to disperse the vertically downward impact power of the water column by centrifugal force, so as to avoid the problem of holes and depressions in the central region of the photoresist layer 14 caused by too strong impact power of the water column as described in other embodiments above.

Figure 10:
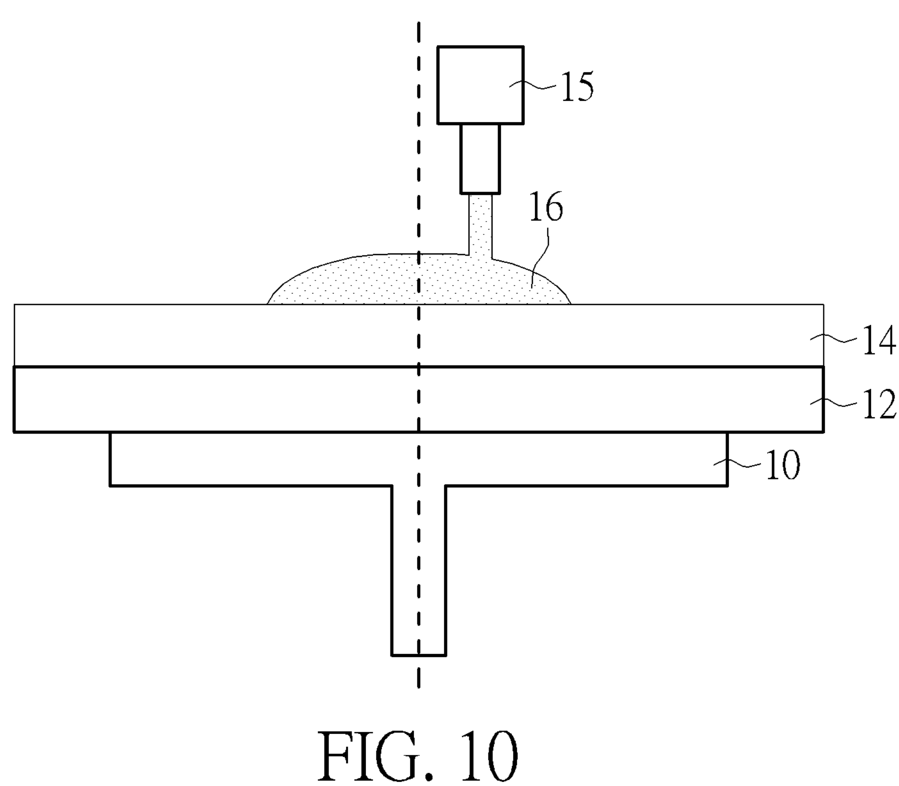
Figures 11, 12:
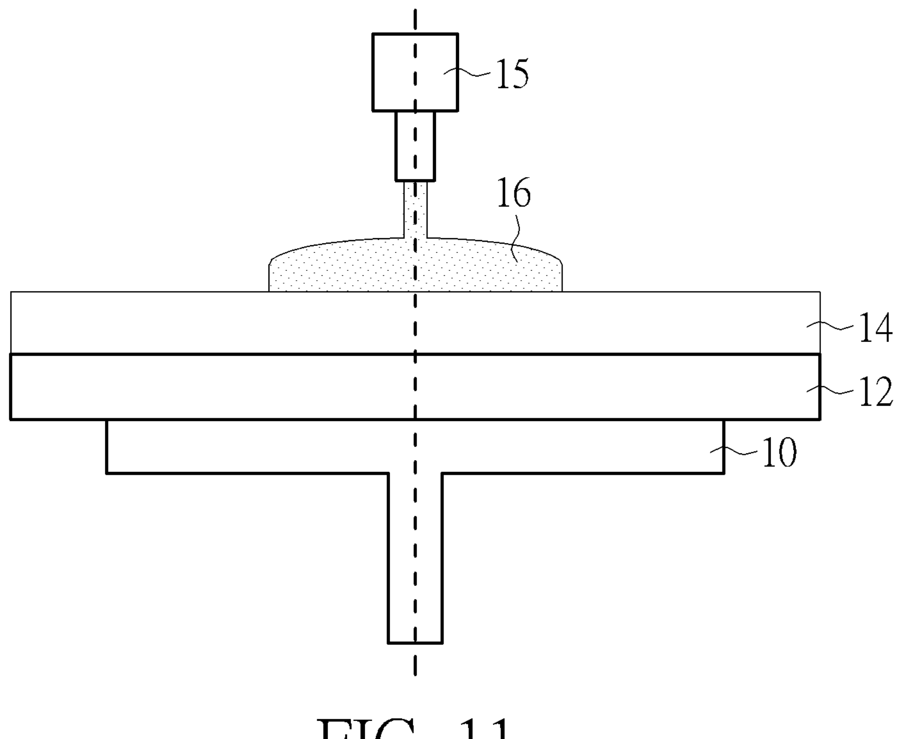

Subsequently, as shown in FIGS. 10 and 11, after the turntable 10 stops rotating, the deionized water 16 is sprayed for a period of time to accumulate enough deionized water 16 on the photoresist layer 14. Then, since the nozzle 15 is not located in the center of the photoresist layer 14, it is necessary to adjust the position of the nozzle 15, for example, to move it to 7 mm next to another center point O. More specifically, if the position of the nozzle 15 in FIG. 9 is 7 mm away from the center point O in the −X direction, the position of the nozzle 15 in FIG. 10 is 7 mm away from the center point O in the +X direction. Subsequently, the nozzle 15 is moved to the central point O to continue spraying sufficient deionized water 16. In this embodiment, the time for spraying the deionized water 16 by the nozzle 15 at the position shown in FIG. 9 is preferably equal to the time for spraying the deionized water 16 at the position shown in FIG. 9, for example, 3 seconds, while the time for spraying the deionized water 16 by the nozzle 15 at the central point O is about 6 seconds (as shown in FIG. 11), but it is not limited to this. In addition, it is worth noting that the turntable 10 did not rotate in the steps shown in FIGS. 10 and 11 except that the turntable 10 did rotate for an instant at first (as shown in FIG. 9).

Then, as shown in FIG. 12, when the deionized water 16 has not been spin-coated, the TARC liquid 18 is directly sprayed on the deionized water 16 to be mixed with it, and the mixed liquid 17 is generated. The subsequent steps are the same as the second preferred embodiment of the present invention, that is, the mixed liquid 17 of deionized water 16 and TARC liquid 18 is spin-coated on the entire surface of the photoresist layer 14 from the central region, and then the baking step is performed to form a TARC film. These steps can be referred to FIGS. 6 to 8, and will not be described here.

Compared with the previous embodiments, this embodiment can solve the problem of micro bubbles around the photoresist layer 14 and the depression in the center of the photoresist layer 14 caused by water column impact, so the overall process quality can be effectively improved.

Based on the above description and drawings, the present invention provides a method for coating top anti-reflective coating, which comprises providing a turntable 10, placing a substrate 12 on the turntable 10, spraying a deionized water 16 onto the photoresist layer 14, and spraying a top anti-reflective coating (TARC) liquid 18 onto the deionized water 16 to mix the top anti-reflective coating liquid 18 with the deionized water 16 to form a mixed liquid 17, and performing a spin coating step to spin-coat and disperse the mixed liquid 17 to form a top anti-reflective coating film 20 on the photoresist layer 14.

In some embodiments of the present invention, after the deionized water 16 is sprayed on the photoresist layer 14, a concentrated water film is formed in the central region of the photoresist layer 14 (as shown in FIG. 6).

In some embodiments of the present invention, the concentrated water film is only located in a central region of the photoresist layer 14, but not in a peripheral region of the photoresist layer 14 (as shown in FIG. 6).

In some embodiments of the present invention, before the mixed liquid 17 is formed, the turntable does not rotate or slowly rotates at a low speed (as shown in FIGS. 6 and 7).

In some embodiments of the present invention, after spraying the top anti-reflective coating liquid 18 onto the deionized water 16 to form the mixed liquid 17, the top anti-reflective coating liquid 18 is continuously sprayed without stopping until a baking step is performed.

In some embodiments of the present invention, after the mixed liquid 17 is coated on the surface of the photoresist layer 14, a baking step is further included.

In some embodiments of the present invention, after the baking step, a central region of the photoresist layer 14 contains a cavity 22 therein, and the cavity 22 is located under the top anti-reflective coating film 20 (as shown in FIG. 8).

The invention also provides a method for coating top anti-reflective coating, which comprises providing a turntable 10, placing a substrate 12 above the turntable 10, and spraying deionized water 16 on the photoresist layer 14, the spraying position of deionized water 16 is at a first offset position (as shown in FIG. 9), and the first offset position is at a unit distance next to a central point o of the photoresist layer 14, and the deionized water 16 is sprayed onto the surface of the photoresist layer 14, the turntable 10 simultaneously performs an instantaneous rotation step, spraying a top anti-reflective coating liquid 18 onto the deionized water 16 to mix the top anti-reflective coating liquid 18 with the deionized water 16 to form a mixed liquid 17, and performs a rotating coating step to spin-coat and disperse the mixed liquid 17 to form a top anti-reflective coating film 20 on the photoresist layer 14.

In some embodiments of the present invention, after the deionized water 16 is sprayed on the surface of the photoresist layer 14, the rotating step is stopped and the deionized water 16 is continuously sprayed at the first offset position.

In some embodiments of the present invention, after the deionized water 16 is sprayed at a first offset position for a period of time, the deionized water 16 is continuously sprayed at a second offset position of the photoresist layer 14 (as shown in FIG. 10), the second offset position is located at a unit distance next to a central point O of the photoresist layer 14.

In some embodiments of the present invention, the second offset position and the first offset position are located in two opposite directions of the center point O.

In some embodiments of the present invention, after the deionized water is sprayed at the second offset position for a period of time, the deionized water 16 is continuously sprayed at the center point O of the photoresist layer 14.

To sum up, the invention is characterized by providing a method for coating a top anti-reflective coating, which comprises the following steps: spraying deionized water on a photoresist layer, mixing the top anti-reflective coating liquid with deionized water before the deionized water is spin-coated, and then spin-coating the mixed liquid. By the method provided by the invention, the consumption of the top anti-reflective coating liquid in the exposure process can be greatly reduced, thereby reducing the cost. In addition, the method provided by the invention can also solve the problems of micro bubbles, central region depression and the like that may be encountered when forming the top anti-reflective coating.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of coating a top antireflective coating, comprising:

providing a turntable, placing a substrate on the turntable with a photoresist layer on the substrate;

spraying a deionized water on the photoresist layer;

spraying a top anti-reflective coating liquid on the deionized water to mix the top anti-reflective coating liquid with the deionized water to form a mixed liquid; and performing a spin coating step to spin-coat and disperse the mixed liquid to form a top anti-reflective coating film on the photoresist layer; and performing a baking step after coating the mixed liquid on the surface of the photoresist layer, wherein after the baking step is performed, a central region of the photoresist layer contains a cavity therein, and the cavity is located under the top anti-reflective coating film.

2. The method for coating the top anti-reflective coating according to claim 1, wherein after spraying the deionized water on the photoresist layer, a concentrated water film is formed in a central region of the photoresist layer.

3. The method for coating top anti-reflective coating according to claim 2, wherein the concentrated water film is only located in the central region of the photoresist layer, but not in a peripheral region of the photoresist layer.

4. The method for coating top anti-reflective coating according to claim 1, wherein the turntable did not rotate or slowly rotated before forming the mixed liquid.

5. The method for coating the top anti-reflective coating according to claim 1, wherein after spraying the top anti-reflective coating liquid onto the deionized water to form the mixed liquid, the top anti-reflective coating liquid is continuously sprayed without stopping until the baking step is performed.

6. A method of coating a top antireflective coating, comprising:

providing a turntable, placing a substrate on the turntable with a photoresist layer on the substrate;

spraying a deionized water on the photoresist layer, wherein the spraying position of the deionized water is at a first offset position, which is at a unit distance next to a central point of the photoresist layer, and when the deionized water is sprayed on the surface of the photoresist layer, the turntable simultaneously performs an instantaneous rotation step;

spraying a top anti-reflective coating liquid on the deionized water to mix the top anti-reflective coating liquid with the deionized water to form a mixed liquid; and performing a spin coating step to spin coat and disperse the mixed liquid to form an anti-reflective coating film on the photoresist layer.

7. The method for coating the top anti-reflective coating according to claim 6, wherein after the deionized water is sprayed on the surface of the photoresist layer, the rotating step is stopped and the deionized water is continuously sprayed at the first offset position.

8. The method for coating the top anti-reflective coating according to claim 7, wherein the deionized water is sprayed at the first offset position for a period of time, and then sprayed at a second offset position of the photoresist layer, wherein the second offset position is located at a unit distance next to a central point of the photoresist layer.

9. The method for coating top anti-reflective coating according to claim 8, wherein the second offset position and the first offset position are located in two opposite directions of the center point.

10. The method for coating the top anti-reflective coating according to claim 8, wherein the deionized water is sprayed at the second offset position for a period of time, and then the deionized water is continuously sprayed at the center point of the photoresist layer.

11. The method for coating the top anti-reflective coating according to claim 6, wherein after spraying the deionized water on the photoresist layer, a concentrated water film is formed at a central region of the photoresist layer.

12. The method for coating top anti-reflective coating according to claim 11, wherein the concentrated water film is only located in the central region of the photoresist layer, but not in a peripheral region of the photoresist layer.

13. The method for coating the top anti-reflective coating according to claim 6, wherein after spraying the top anti-reflective coating liquid onto the deionized water to form the mixed liquid, the top anti-reflective coating liquid is continuously sprayed without stopping until a baking step is performed.

* * * * *